US009793216B2

(12) United States Patent
Nag et al.

(10) Patent No.: US 9,793,216 B2
(45) Date of Patent: Oct. 17, 2017

(54) FABRICATION OF IC STRUCTURE WITH METAL PLUG

(71) Applicant: GLOBALFOUNDRIES INC., Grand Cayman (KY)

(72) Inventors: Joyeeta Nag, Clifton Park, NY (US); Jim Shih-Chun Liang, Poughkeepsie, NY (US); Domingo A. Ferrer Luppi, Fishkill, NY (US); Atsushi Ogino, Fishkill, NY (US); Andrew H. Simon, Fishkill, NY (US); Michael P. Chudzik, Mountain View, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/006,426

(22) Filed: Jan. 26, 2016

(65) Prior Publication Data

US 2017/0213792 A1 Jul. 27, 2017

(51) Int. Cl.
*H01L 23/48* (2006.01)
*H01L 23/535* (2006.01)
*H01L 21/768* (2006.01)
*H01L 23/532* (2006.01)

(52) U.S. Cl.
CPC ...... *H01L 23/535* (2013.01); *H01L 21/76805* (2013.01); *H01L 21/76843* (2013.01); *H01L 21/76895* (2013.01); *H01L 23/53266* (2013.01)

(58) Field of Classification Search
CPC ............. H01L 23/535; H01L 21/76805; H01L 21/76843; H01L 21/76895; H01L 23/53266
See application file for complete search history.

(56) References Cited

U.S. PATENT DOCUMENTS

| 5,484,747 | A | 1/1996 | Chien |
| 5,683,938 | A | 11/1997 | Kim et al. |
| 6,124,205 | A | 9/2000 | Doan |
| 6,376,158 | B1 | 4/2002 | Jones et al. |
| 7,074,690 | B1 | 7/2006 | Gauri et al. |

(Continued)

FOREIGN PATENT DOCUMENTS

EP 0435388 B1 12/1990

*Primary Examiner* — Long Pham
(74) *Attorney, Agent, or Firm* — Yuanmin Cai; Hoffman Warnick LLC

(57) ABSTRACT

Aspects of the present disclosure include integrated circuit (IC) structures with metal plugs therein, and methods of forming the same. An IC fabrication method according to embodiments of the present disclosure can include: providing a structure including a via including a bulk semiconductor material therein, wherein the via further includes a cavity extending from a top surface of the via to an interior surface of the via, and wherein a portion of the bulk semiconductor material defines at least one sidewall of the cavity; forming a first metal level on the via, wherein the first metal level includes a contact opening positioned over the cavity of the via; forming a metal plug within the cavity to the surface of the via, such that the metal plug conformally contacts a sidewall of the cavity and the interior surface of the via, wherein the metal plug is laterally distal to an exterior sidewall of the via; and forming a contact within the contact opening of the first metal level.

17 Claims, 5 Drawing Sheets

(56) References Cited

U.S. PATENT DOCUMENTS

| | | | |
|---|---|---|---|
| 2001/0016417 A1* | 8/2001 | Thakur | H01L 21/28518 438/649 |
| 2007/0020904 A1 | 1/2007 | Stora | |
| 2009/0239062 A1* | 9/2009 | Cotte | H01L 21/2885 428/332 |
| 2009/0309168 A1 | 12/2009 | Chang | |
| 2012/0309163 A1* | 12/2012 | Kiyomura | H01L 27/10817 438/396 |
| 2015/0187643 A1* | 7/2015 | Kakimoto | H01L 21/28531 438/607 |

* cited by examiner

FABRICATION OF IC STRUCTURE WITH METAL PLUG

TECHNICAL FIELD

The subject matter disclosed herein relates to integrated circuit (IC) structures for connecting one or more device layers of a product to one or more metal layers of the same product. More specifically, aspects of the disclosure relate to IC structures which include one or more metal plugs formed within a local interconnect layer of the IC.

BACKGROUND

Each IC of a particular device can be made up of billions of interconnected devices, such as transistors, resistors, capacitors, and diodes, located on one or more layers of an IC. The quality and viability of a product including an IC can be at least partially dependent on the techniques used for fabricating the IC and the structure of various components therein. Fabrication of an IC can include two major phases: front end of line (FEOL) processes and back end of line (BEOL) processes. FEOL processes generally include fabrication processes performed on a wafer up to and including the formation of a first "metal level," i.e., a metal wire for connecting several semiconductor devices together. BEOL processes generally include steps subsequent to forming a first metal level, including the formation of all subsequent metal levels. To provide greater scaling and sophistication of the fabricated device, the number of metal levels can be varied to suit a particular application, e.g., by providing four to six metal levels, or as many as, in a further example, sixteen or more metal levels. To connect components formed in FEOL processes to those formed in BEOL processes, a local interconnect (LI) layer can be formed on components fabricated in the FEOL processes, followed by deposition and/or bonding of components fabricated in BEOL processes onto the LI layer.

Components fabricated in FEOL processes can be electrically interconnected to those formed in BEOL processes by the use of vertical metal wires, also known as "vias." Each via can traverse one or more regions of dielectric material, in addition to other intervening metal levels and/or insulator layers of dielectric material. Vias can present a significant manufacturing challenge, because an electrical short affecting the via can affect the operation of an entire product. In some circumstances, the amount of electrical resistance across a via may vary based on the processes used to fabricate the via and/or its adjacent components or layers. Process improvement in the fabrication of IC products thus may be concerned with reducing the number of potential defects in an LI layer and elsewhere, while maintaining process simplicity and reducing the total number of steps required to fabricate an IC.

BRIEF SUMMARY

A first embodiment of the present disclosure provides a method of forming an integrated circuit (IC) structure, the method including: providing a structure including a via including a bulk semiconductor material therein, wherein the via further includes a cavity extending from a top surface of the via to an interior surface of the via, and wherein a portion of the bulk semiconductor material defines at least one sidewall of the cavity; forming a first metal level on the via, wherein the first metal level includes a contact opening positioned over the cavity of the via; forming a metal plug within the cavity to the surface of the via, such that the metal plug conformally contacts a sidewall of the cavity and the interior surface of the via, wherein the metal plug is laterally distal to an exterior sidewall of the via; and forming a contact within the contact opening of the first metal level.

A second embodiment of the present disclosure provides a method of forming an IC structure, the method including: providing a structure including a via including a bulk semiconductor material therein, wherein the via further includes a cavity extending from a top surface of the via to an interior surface of the via, and wherein a portion of the bulk semiconductor material defines at least one sidewall of the cavity; forming a metal plug within the cavity to the surface of the via, such that the metal plug conformally contacts a sidewall of the cavity and the interior surface of the via, wherein the metal plug is laterally distal to an exterior sidewall of the via; and forming a first metal level on the structure, such that a contact within a first metal level of the first metal level is electrically coupled to the metal plug.

A third embodiment of the present disclosure provides an IC structure including: a via including a bulk semiconductor material therein and positioned within an insulator, wherein the via includes a metal plug extending from a top surface of the via to an interior surface of the via, such that the metal plug conformally contacts the interior surface of the via and at least one sidewall of the bulk semiconductor material, wherein the metal plug is laterally distal to an exterior sidewall of the via, and wherein a material composition of the metal plug is different from a material composition of the via; and a refractory metal liner positioned on the metal plug of the via, wherein the refractory metal liner separates the metal plug from a contact positioned over the via.

BRIEF DESCRIPTION OF THE DRAWINGS

These and other features of the present disclosure will be more readily understood from the following detailed description of the various aspects of the disclosure taken in conjunction with the accompanying drawings that depict various embodiments of the disclosure, in which.

Figure 1:
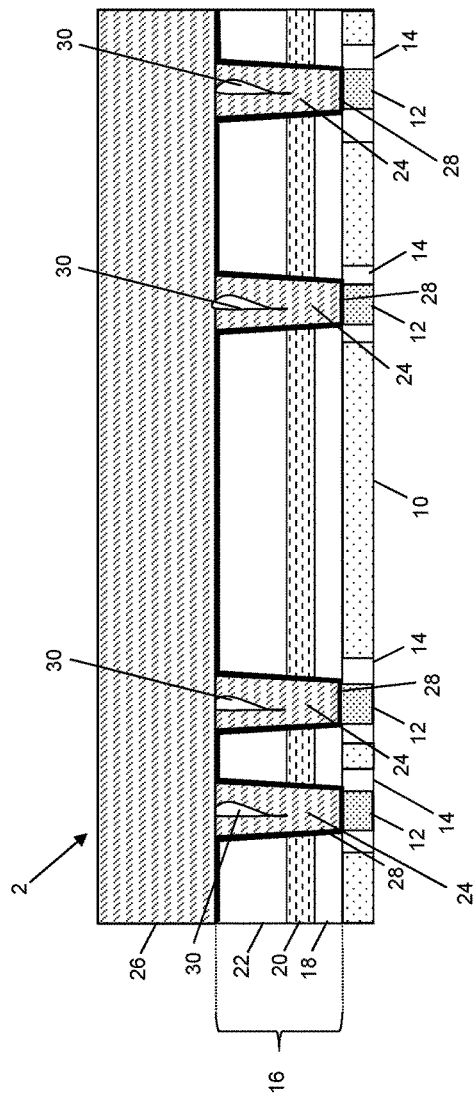
FIG. 1 shows a cross-sectional view of an initial integrated circuit (IC) structure with cavities according to embodiments of the present disclosure.

It is noted that the drawings of the present disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure integrated circuit (IC) structures incorporating a metal plug, e.g., within a via of a local interconnect layer, and methods of forming the same. Methods according to the present disclosure can be performed on an IC structure which include at least a via, fabricated from a bulk semiconductor material. As a result of metal deposition or other fabrication processes, a portion of the via may include an electrically insulative cavity extending from a top surface of the via to an interior of the via such that the cavity includes a sidewall directly adjacent to and defined by a portion of the bulk semiconductor material. It has been discovered that the presence of cavities within the formed via may negatively affect the operation of an IC which includes the via and its electrically insulative cavity. To form a metal plug within the cavity of the via, methods of the present disclosure including forming a first metal level on the via, such that the first metal level includes a contact opening positioned over the cavity of the via. A metal plug can then be formed within the contact opening, such that the metal plug fills the cavity of the via, e.g., by conformally contacting the interior of the via at a bottom surface thereof, and sidewalls of the bulk semiconductor material, such that the metal plug is laterally distal to an exterior sidewall of the via. The metal plug can extend from the interior of the via to the surface of the via. An upper surface of the metal plug can be substantially coplanar with the surface of the via. Thereafter, a contact can be formed within the contacting opening and above the metal plug, to form an electrical connection between the via and one or more metal level layers positioned thereon.

Referring to FIG. 1, a structure 2 used for fabricating an IC according to aspects of the present disclosure is shown. Structure 2, as depicted in FIG. 1, can be the result of metal formation processes, e.g., patterning, removal, deposition, etc., pursuant to photolithography techniques. Structure 2 can include a substrate 10 including doped semiconductor regions 12 and shallow trench isolations (STIs) 14 therein. Each doped semiconductor region 12 can be composed of any currently known or later developed semiconductor material with dopants therein to yield a doped semiconductive substance. The semiconductor materials of doped semiconductor region 12 may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of doped semiconductor region 12 or a portion thereof may be strained. Each doped semiconductor region 12 can include a concentration of one or more dopant materials therein. As described herein, "doping" refers to a process by which an impurity or "dopant" is introduced into a semiconductive material to alter its electrical properties, e.g., the conductivity and resistivity of a material. With respect to structure 2, doped semiconductor region(s) 12 can be doped to increase the conductivity of the original material. As example, doped semiconductor region(s) 12 can be composed of, e.g., silicon (Si) and/or silicon germanium (SiGe) with various dopant materials (e.g., "p-type" or "n-type") therein to provide electrical conductivity. Regardless of composition, doped semiconductor regions 12 can be formed, e.g., by implantation, before additional materials are formed on substrate 10. Implantation refers to a process in which ions are accelerated toward a solid surface and penetrate the solid up to a predetermined depth, determined by ion energy. Implantation can be distinguished from epitaxial growth in that the material retains its existing dimensions, but portions of the material acquire varying properties as a result of the introduced ions.

Substrate 10 can also include STI(s) 14 positioned laterally between conductive and semiconductor regions of a particular layer, e.g., doped semiconductor regions 12 and/or other regions of substrate 10. STI(s) 14 can be formed by removing portions of substrate 10 to form trenches and then filling the trenches with an electrically insulative material. For example, STI(s) 14 may be composed of any insulating material such as $SiO_2$ or a "high-k" dielectric having a high dielectric constant, which may be, for example, above 3.9. The composition of first insulator 12 can include, e.g., silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar electrically insulating properties. In some applications, substrate 10 can be provided as a bulk substrate, silicon on insulator (SOI) substrate, or another type of substrate. Where substrate 10 is provided as an SOI substrate, substrate 10 can be positioned over a buried insulator (not shown), also known as a BOX layer, composed of one or more of the example insulating materials discussed herein relative to STI(s) 14.

Structure 2 can include a local interconnect (LI) layer 16 positioned on substrate 10. LI level 16, also known as a "via layer" or "middle of line" (MOL) component, can be formed on substrate 10 to physically and electrically couple substrate 10 to components formed in a back end of line (BEOL) process, e.g., metal level layers described herein. LI level 16 can include a first insulator region 18, a second insulator region 20, and a third insulator region 22 stacked on top of each other. First and third insulator regions can be composed of one or more currently known or later developed insulator materials such as one of the various insulator materials described elsewhere herein with respect to STIs 14, and more specifically can be composed of tetraethyl orthosilicate (TEOS), an electrically and physically inert material capable of being formed as a conformal coating on an underlying layer. Second insulator region 20 can have a different composition from that of first insulator region 18. In an example embodiment, second insulator region 20 can be composed of a silicon nitride compound (SiN, $Si_3N_4$, etc.). Third insulator region 22 can be composed of yet another electrically insulating material, or alternatively can have the same composition as first insulator region. For example, third insulator region can be composed of TEOS to provide another conformal coating on second insulator region 20. In an example embodiment, first and second insulator regions 18, 20 can have a thickness of, e.g., approximately twenty nanometers (nm), while third insulator region 22 can have a thickness of, e.g., approximately forty nm. The terms "approximate," "approximately," or variants thereof as used herein can refer to the particular values and/or measurements specified in addition to other values capable of yielding substantially the same technical effects, or amounts bounded by a margin of error, e.g., five percent, ten percent, fifteen percent, of the enumerated amounts.

LI level 16 can include a group of vias 24 therein, formed within via openings of LI level 16. During the fabrication of structure 2, LI level 16 can be formed as a set of continuous layers, before portions thereof are removed to form via openings. The via openings can then be filled with a bulk semiconductor material to form vias 24. More specifically, a layer of bulk semiconductor material 26 can be formed on structure 22 to fill via openings within LI level 16. Bulk semiconductor material 26, in addition to one or more conventional semiconductor materials, can also include one or more electrically conductive metals such as tungsten (W), copper (Cu), aluminum (Al), silver (Ag), etc., therein. In an example embodiment, bulk semiconductor material 26 can be formed by selectively removing portions of LI level 16 to form via openings, and forming semiconductor material and/or a metal or metal compound therein, e.g., by a metal deposition process. In addition, one or more liners 28 can also be formed between one or more insulator regions 18, 20, 22 of LI level 16 and vias 24. Liners 28 can be formed on sidewalls of each via opening before bulk semiconductor material 26 is formed therein. Vias 24 and bulk semiconductor material 26 can be formed, e.g., by deposition on an upper surface of LI level 16 and via openings therein. The terms "depositing" or "deposition," as used herein, may include any now known or later developed techniques appropriate for the material to be deposited including but are not limited to, for example: chemical vapor deposition (CVD), low-pressure CVD (LPCVD), plasma-enhanced CVD (PECVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Following deposition, some of the deposited material may be positioned directly on and in contact with LI level 16, such as within via openings thereof.

Figure 2:
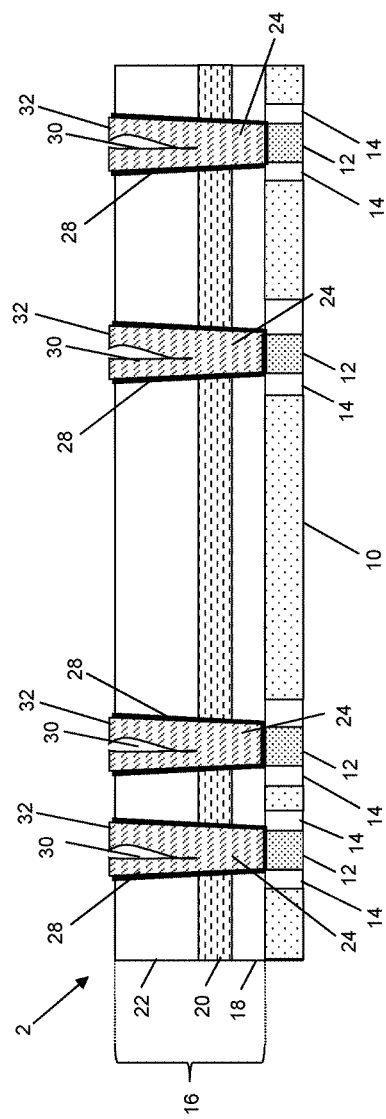
FIG. 2 shows a cross-sectional view of a planarized IC structure with exposed cavities according to embodiments of the present disclosure.

Turning to FIG. 2, processes of the present disclosure can include removing bulk semiconductor material 26 (FIG. 1) from structure 2 (FIG. 1), e.g., selectively or non-selectively. The term "removing," as used herein, can include any one of various material removal or polishing techniques now known or later developed, including polishing or etching. One type of polishing can include the application of chemical-mechanical polishing (CMP), also known as chemical-mechanical planarization. CMP is a process, using both chemicals and abrasives, comparable to lapping (analogous to sanding), for removing material from a built up structure. For example, after depositing and etching a number of elements, the top surface of the resulting structure may be uneven and in need of smoothing (or leveling), prior to performing a subsequent process step. Generally, CMP will level the high spots of a structure, leaving a relatively smooth and planar surface. Another type of process, "etching," generally refers to the removal of material from a substrate (or structures formed on the substrate), and is often performed with a mask in place so that material may be selectively removed from a structure, while leaving the remaining material unaffected. Etching may be performed using a plasma. Plasma systems can operate in several modes by adjusting the parameters of the plasma. Ordinary plasma etching produces energetic free radicals, neutrally charged, that react at the surface of the wafer. Since neutral particles contact the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trenches (e.g., where STI(s) 14 can be formed).

Regardless of the process used, removing bulk semiconductor material 26 can expose one or more cavities 30 extending from a top surface 32 of via 24 to an interior of the same. During operation of an IC structure, cavities 30 may impede the flow of electric current from one circuit element to another through via 24, and/or can cause conductive metals from adjacent components to migrate into cavities 30 during subsequent processes in conventional fabrication techniques. Cavities 30 may become embedded within vias 24 as bulk semiconductor material 26 (FIG. 1) is formed, e.g., as a result of vias 24 having a diminished cross-sectional area relative to a remainder of IC structure 2. As a result, cavities 30 can be formed such that their sidewalls are directly adjacent to and defined by interior sidewalls of buld semiconductor material 26. Applicants have thus discovered that cavities 30 may appear in one or more vias 24 during the fabrication of an IC product and in some cases can contribute to volatility during operation.

Figure 3:
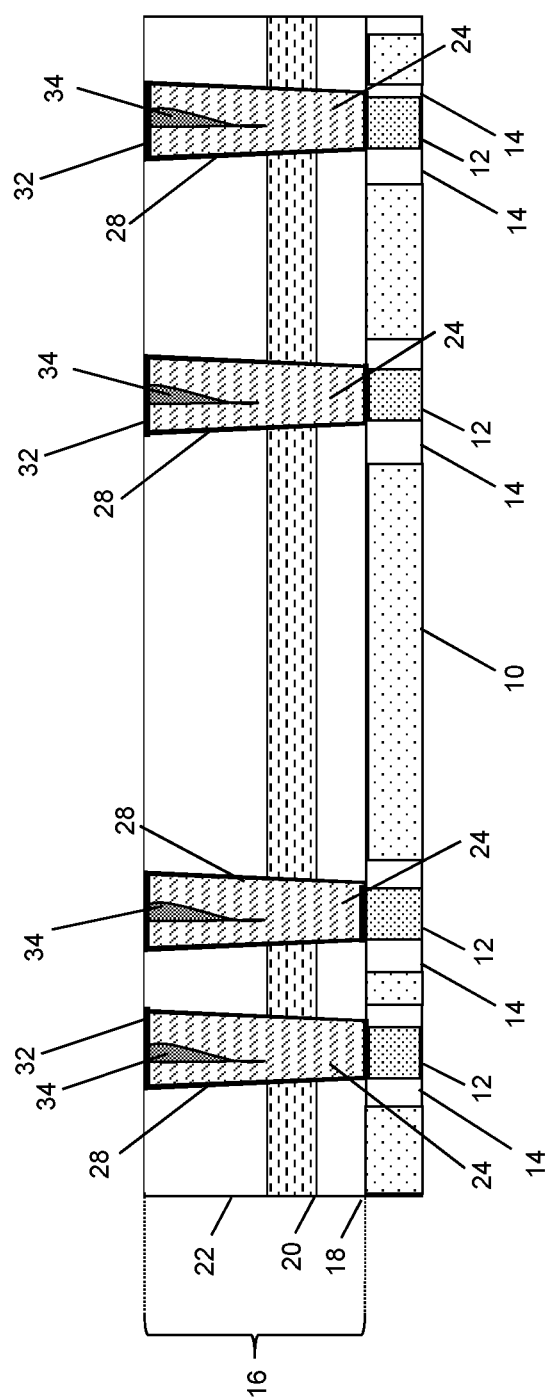
FIG. 3 shows a cross-sectional view of an IC structure with metal plugs according to embodiments of the present disclosure.
Figure 4:
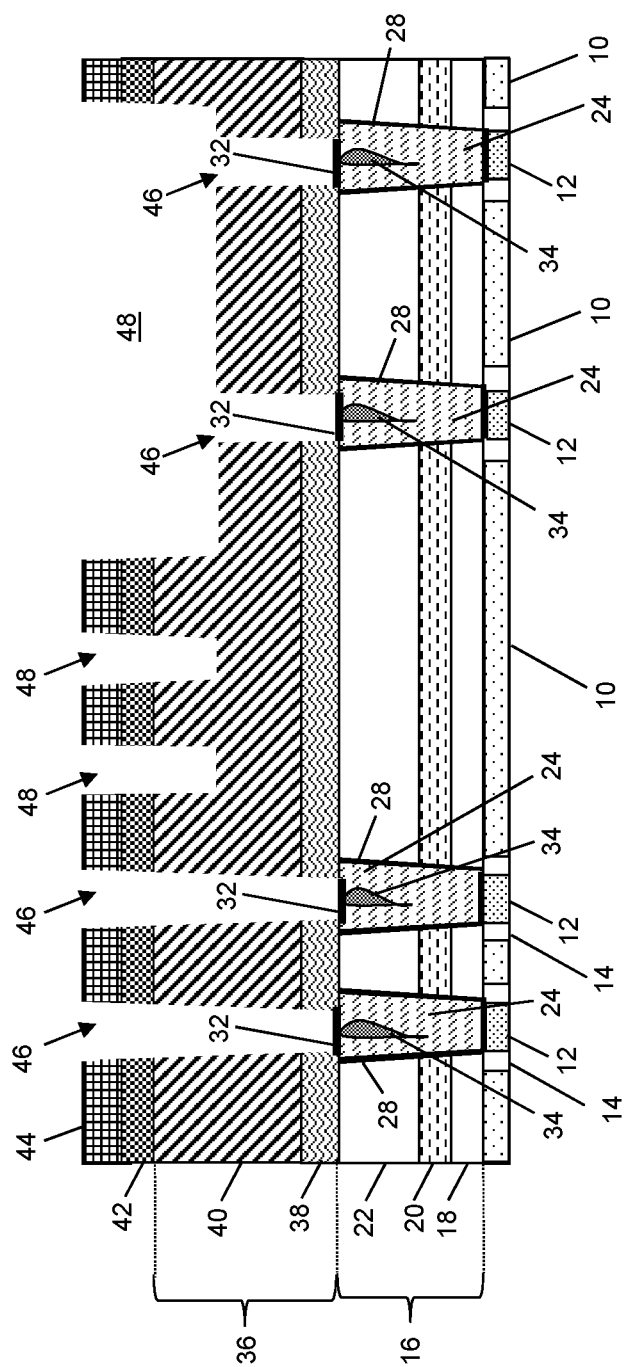
FIG. 4 shows a cross-sectional view of an IC structure with metal plugs and first metal level thereon according to embodiments of the present disclosure.

Turning to FIG. 3, embodiments of the present disclosure can include techniques for selectively filling cavities 30 (FIG. 2) of vias 24 without affecting other attributes of an IC product. A first example process of forming a metal plug 34 within via(s) 24 is shown in FIG. 3, while another example process of forming metal plug 34 within via(s) 24 is illustrated in FIG. 4 and described in detail elsewhere herein. In an embodiment, metal plug(s) 34 can each be formed within respective cavities 30 to top surface 32 of each via 24 immediately following the exposure of cavities 30. Metal plug 34 can be formed, e.g., by application of a selective metal deposition process such that each metal plug 34 conformally contact the sidewalls and bottom of its respective cavity 30, such that metal plug(s) 34 are laterally distal to and circumferentially positioned within the exterior sidewalls of each via 24. In this manner, metal plug(s) 34 can be formed to contact a lower surface of the interior of each via 24. Selective metal deposition generally refers to a process by which metal particles are formed or grown on some portions of an IC structure without being formed on or otherwise affecting other portions. A selective metal deposition can provide a mechanism by which, e.g., metals are formed on other metals or conductive structures without being formed on insulative materials such as the various insulating materials of LI level 16.

An example of a selective metal deposition process can include, e.g., selective area chemical vapor deposition (SACVD), in which a film of material (e.g., a metal) is deposited in selected areas of an IC structure only. The selectivity of the deposition can be controlled by the chemical composition of the surface and the materials being deposited, e.g., by bond formation or cohesion being possible on metal surfaces but not on the surface of insulator materials such as oxides. To form metal plug(s) 34 by way of selective metal deposition, metal plug(s) 34 can be formed by depositing tungsten (W), cobalt (Co), ruthenium (Ru), rhodium (Rh), molybdenum (Mo), tantalum (Ta), tantalum nitride (TaN), aluminum (Al), and/or alloys thereof in a single-step SACVD and/or plating process. It is also understood that any currently-known or later developed conductive material can be used to form metal plug(s) 34 within cavities 30. In embodiments where one or more metal plug(s) 34 are composed of tungsten, the chemical composition of vias 24 may be homogeneous with that of metal plug(s) 34. The composition of metal plug(s) 34 can provide varying technical effects, e.g., the relative ability to impede migration of copper (Cu) from adjacent components or wires into via 24. For example, some metals may offer varying amounts of resistivity and/or ability to prevent Cu migration to via(s) 24, depending on the composition of via(s) 24 and anticipated application. Metal plug(s) 34 may, initially, extend from a lower interior surface of each via 24 to a point above top surface 32 of each via 24. To preserve the position and electrical properties of each via 24, vias 24 and metal plug 34 can then be planarized (e.g., by application of a buff CMP) before forming other materials on LI level 16 and/or implementing other fabrication steps. In some embodiments, e.g., where selective metallization is applied to form metal plugs 34, the subsequent planarization of metal plug 34 may be omitted.

Turning to FIG. 4, embodiments of the present disclosure can alternatively include forming additional structures of LI level 16 before forming metal plug(s) 34 (FIG. 3) in cavities 30 of vias 24. For example, a first metal level 36 can be formed on the upper surface of LI level 16 with a group of individual structures therein. Each component of first metal level 36 can be formed, e.g., by deposition or other process of forming a material, followed by planarization (e.g., CMP) to form a planar upper surface. Although first metal level 36 may initially lack a metal or conductive substance therein, one or more metal wires can be formed within first metal level 36 during subsequent process steps as described herein. A dielectric cap 38 can be formed on LI level 16, and within cavities 30 (FIG. 2) of each via 24 before being planarized. Dielectric cap 38 can be composed of one or more of the insulating materials described elsewhere herein with respect to STI(s) 14, insulator regions 18, 20, 22, and/or can be composed of another dielectric material. In an example embodiment, dielectric cap 38 can have a thickness of, e.g., approximately twenty nm. A fourth insulator region 40 can then be formed on an upper surface dielectric cap 38, and can be composed of, e.g., a low-k dielectric material and/or any other currently known or later developed dielectric material. In an example embodiment, fourth insulator region 40 can have a thickness of, e.g., approximately ninety-five nm.

To prepare for the forming and positioning of conductive metals in subsequent process steps, a series of masking and etching steps are performed. In an example embodiment, a memory layer for forming a set of trenches can be formed by application of litho-etch-litho-etch (LELE) processing. Thereafter, another memory layer for forming a set of vias can be formed above the memory layer for the trenches, e.g., by another application of LELE processing. It is also understood that other masking and/or etching processes can be performed to form and position conductive metals on LI level 16. To implement LELE processing of LI level 16, a first hard mask 42 can be formed directly on first metal level 36 and can include insulative masking materials such as, e.g., oxide hard masks, nitride hard masks, etc. In addition, a second hard mask 44 can be positioned on first hard mask 42 and can be composed of, e.g., one or more metals. During the processing of first metal level 36, the formed trench and via memorization layers can be physically separated from one another by a planarization layer such as organic planarization layer (OPL). The OPL separating the two memory layers can, e.g., planarize one or more trench surfaces in order for the via memory layer(s) to be deposited and patterned. A removal process such as etching (e.g., a final dual-damascene RIE) can thereafter defines a trench-via structure to yield a group of contact openings 46 as shown in FIG. 4. Although contact openings 46 are generally defined by reference to "contacts" formed therein, it is understood that a plurality of structures such as liners, vias, metal wires, etc., may each be formed in one or more contact openings 46

Contact openings 46 and wire openings 48 can be formed in first metal level 36 as shown in FIG. 4. Where contacts are to be positioned beneath a connecting layer of metal wire in the resulting structure, a wire opening 48 can be formed, e.g., by application of multiple fabrication steps as described herein. To remove the portions of dielectric cap 38 from first metal level 36, the forming of contact opening(s) 46 can include selectively etching to remove only dielectric cap 38. For example, applying a dry RIE to dielectric cap(s) 38 can rapidly remove dielectric cap(s) 38 while substantially leaving other materials intact, including the composition of via(s) 24 and metal plug(s) 34. In embodiments where metal plug(s) 34 are formed conformally on the sidewalls and lower surfaces of cavities 30 (FIG. 2) in via(s) 24 before the forming of first metal level 36, it is thus understood that contact openings 46 can be formed without removing metal plug(s) 34, e.g., by using a different selective etching process.

In any event, the forming of contact openings 46 can expose cavities 30 (FIG. 2) of vias 24. At this stage, metal plug(s) 34 can then be formed within each via 24 to conformally coat exposed sidewalls and surfaces of cavity 30 (e.g., contacting only bulk semiconductor material 26) by application of one or more processes of selectively forming a metal on bulk semiconductive materials. Example processes of forming a metal, e.g., SACVD, are discussed in detail elsewhere herein and can be applied to the example embodiment depicted in FIG. 4. The formed metal plug(s) 34 can be formed to extend approximately to top surface 32 of via(s) 24, e.g., by terminating the forming of metal plug(s) 34 after filling to the approximate thickness of third insulator region 22. However, it is understood that in some embodiments a portion of metal plug(s) 34 can extend into first metal level 36, provided that at least cavities 30 (FIG. 2) of vias 24 are filled with respective metal plug(s) 34.

Figure 5:
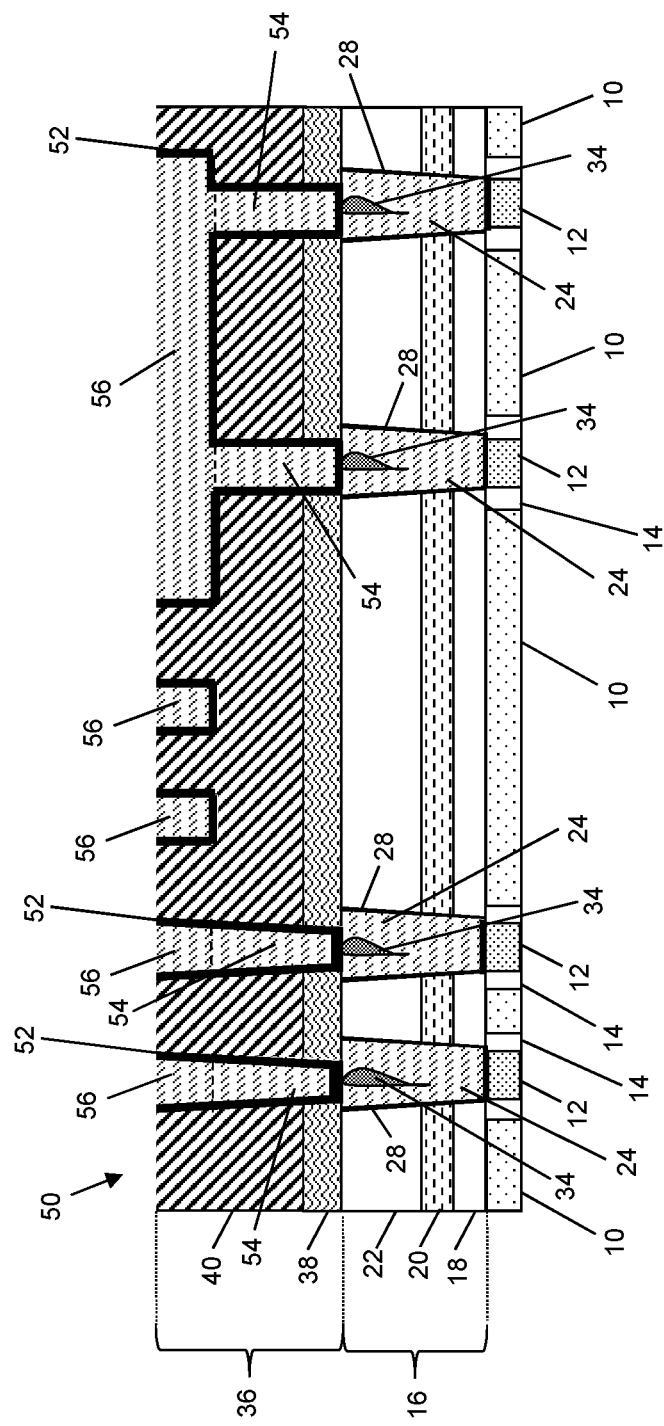
FIG. 5 shows a cross-sectional view of an IC structure with metal plugs formed in exposed cavities according to embodiments of the present disclosure.

Turning to FIG. 5, additional fabrication steps to form an IC structure 50 according to embodiments of the present disclosure are shown. To provide additional insulation between conductive components, and to form a barrier for preventing migration of compounds into via 24 from adjacent structures, embodiments of the present disclosure can include forming liners 52 including, e.g., refractory metal compounds such as a tantalum nitride (TaN) and/or tantalum (Ta), conformally upon sidewalls of each contact opening 46 (FIG. 4) and wire opening 48 (FIG. 4) within first metal level 38. A set of contacts 54, composed of one or more conductive metals such as one or more of the bulk materials described elsewhere herein with respect to via(s) 24, can then be formed within respective contact openings 46. It is also understood that contacts 54 can have the same material composition as via(s) 24 or can have a different material composition. In addition or alternatively to TaN and/or Ta, liners 52 can be composed of other metals such as cobalt (Co), manganese (Mn), titanium (Ti), tungsten (W), ruthenium (Ru), iridium (Ir), rhodium (Rh) and platinum (Pt), etc., or mixtures of thereof (e.g., alloys). Liner(s) 52 can be positioned on the outer surface of each contact 54, including vertical and horizontal surfaces, to physically separate contact(s) 54 from adjacent components. In an example embodiment, liner(s) 52 can be positioned directly between adjacent vias 24 and contacts 54. The composition of liners 52 (e.g., being composed of one or more of the example materials described herein) can provide sufficient conductivity for electrical currents to travel between vias 24 and/or contacts 54, while obstructing or preventing vertical migration of conductive materials from contact(s) 54 into vias 24 and/or metal plug(s) 34. Each liner 52 can also increase the amount of electrical insulation between laterally spaced contacts 54 where portions of dielectric cap 38 and/or fourth insulator layer 40 are positioned therebetween.

In addition to contacts 54 within first metal level 38, IC structure 50 can include one or more metal wires 56 extending, e.g., laterally into and/or out of the plane of the page. As indicated by the phantom lines separating metal wire(s) 56 from contact(s) 54 in FIG. 5, metal wire 56 can have the same material composition as one or more of contacts 54, or can be composed of another electrically conductive material. Metal wire 56 can thus be structurally continuous with one or more contacts 54 and can be formed as part of a unitary metal formation step (e.g., a single metal deposition). In addition or alternatively, metal wire(s) 56 can be formed separately from contact(s) 54 and/or other electrically conductive materials coupled thereto. Contacts 54 can thereby couple corresponding vias 24 of LI level 16 to metal wires 56 positioned in first metal level 36, and/or other metal wires (not shown) positioned in other metal levels (not shown) of IC structure 50. First metal level 36 can thus represent one metal level of a BEOL stack which includes several metal levels therein, e.g., four metal levels, eight metal levels, sixteen metal levels, and/or any conceivable number of distinct metal levels therein with respective contacts, wires, insulator materials, etc.

Where IC structure 50 is formed with metal plug(s) 34 of a different chemical composition from that of via(s) 24, IC structure 50 can be structurally distinguished from other IC products based on the material composition of LI level 16 and components thereof. For instance, where each via 24 is composed of tungsten, metal plug(s) 34 can be composed of cobalt (Co) and can form a barrier to prevent other metals (e.g., copper (Cu)) of contact(s) 54 from migrating to adjacent via(s) 24. The varying material composition of metal plug(s) 34 relative to via(s) 24 can thus provide greater stability to IC structure 50 during operation, and can reduce or prevent material degradation at the interface between contact(s) 54 and via(s) 24. It is also understood that, in some applications the material composition of metal plug(s) 34 can be identical to that of via(s) 24, e.g., where liner 52 also divides contact 54 from via 24. In any event, the position and composition of metal plug(s) 34 can provide an additional conductive materials where electrical current can flow through IC structure 50 during operation.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of forming an integrated circuit (IC) structure, the method comprising:
    providing a structure including a local interconnect (LI) level having an upper surface and a plurality of via openings within the upper surface;
    forming a bulk semiconductor material on the LI level to fill the plurality of via openings, wherein an upper surface of the bulk semiconductor material is positioned over an upper surface of the LI level;
    planarizing the bulk semiconductor material to the upper surface of the LI level, wherein a remaining portion of the bulk semiconductor material within the plurality of via openings defines a plurality of vias, and wherein the planarizing yields a cavity extending from a top surface of one of the plurality of vias to an interior surface of the via, and wherein a portion of the bulk semiconductor material defines at least one sidewall of the cavity;
    forming a metal plug within the cavity to the interior surface of the via, such that the metal plug conformally contacts a sidewall of the cavity and the interior surface of the via, wherein the metal plug is laterally distal to an exterior sidewall of the via; and
    forming a first metal level on the structure, such that a contact within a first metal level of the first metal level is electrically coupled to the metal plug.

2. The method of claim 1, further comprising planarizing the surface of the via after the forming of the metal plug.

3. The method of claim 1, wherein an outer surface of the contact includes a refractory metal liner, and wherein the refractory metal liner separates the contact from the via.

4. The method of claim 1, wherein the refractory metal liner includes one of tantalum (Ta) and tantalum nitride (TaN).

5. The method of claim 1, wherein the metal plug includes one of tungsten (W), cobalt (Co), ruthenium (Ru), and aluminum (Al).

6. The method of claim 1, wherein the selective filling of the cavity of the via with the metal plug comprises a single-step selective metal deposition.

7. The method of claim 1, wherein the via is positioned within an insulator of a local interconnect (LI) level.

8. The method of claim 1, wherein the planarizing of the bulk semiconductor material comprises a single chemical mechanical polishing (CMP) of the bulk semiconductor material to form the cavity.

9. A method of forming an integrated circuit (IC) structure, the method comprising:
- planarizing a tungsten layer to yield a tungsten via, wherein after the planarizing, the tungsten via after planarized includes a cavity extending from a top surface of the via to an interior surface of the tungsten via, and wherein a portion of the tungsten via defines at least one sidewall of the cavity;
- forming a cobalt plug within the cavity to the surface of the tungsten via, such that the cobalt plug conformally contacts a sidewall of the cavity and the interior surface of the tungsten via, wherein the cobalt plug is laterally distal to an exterior sidewall of the tungsten via; and
- forming a first metal level on the structure, such that a contact within a first metal level of the first metal level is electrically coupled to the cobalt plug.

10. The method of claim 9, wherein the planarizing of the tungsten layer includes:
- providing a local interconnect (LI) level having an upper surface and a plurality of via openings within the upper surface;
- forming the tungsten layer on the LI level to fill the plurality of via openings, wherein an upper surface of the tungsten layer is positioned over an upper surface of the LI level;
- planarizing the tungsten layer to the upper surface of the LI level, wherein a remaining portion of the tungsten layer within the plurality of via openings defines a plurality of vias including the tungsten via within the LI level, and wherein the planarizing forms the cavity within the tungsten via.

11. The method of claim 10, further comprising planarizing the surface of the tungsten via after the forming of the cobalt plug.

12. The method of claim 10, wherein an outer surface of the contact includes a refractory metal liner, and wherein the refractory metal liner separates the contact from the tungsten via.

13. The method of claim 10, wherein the planarizing of the tungsten layer comprises a single chemical mechanical polishing (CMP) of the tungsten layer to form the cavity within the tungsten via.

14. The method of claim 12, wherein the refractory metal liner includes one of tantalum (Ta) and tantalum nitride (TaN).

15. The method of claim 9, wherein the selective filling of the cavity of the tungsten via with the cobalt plug comprises a single-step selective metal deposition.

16. The method of claim 9, wherein the tungsten via is positioned within an insulator of a local interconnect (LI) level.

17. The method of claim 9, wherein the tungsten via comprises one of a plurality of tungsten vias of the structure, each of the plurality of tungsten vias having a respective cavity, and wherein forming the cobalt plug comprises simultaneously filling each cavity of the plurality of tungsten vias by selective metal deposition.

* * * * *